(12) United States Patent
Wan et al.

(10) Patent No.: US 12,027,369 B2
(45) Date of Patent: Jul. 2, 2024

(54) MASK STRUCTURE, SEMICONDUCTOR STRUCTURE AND METHODS FOR MANUFACTURING SAME

(71) Applicant: CHANGXIN MEMORY TECHNOLOGIES, INC., Hefei (CN)

(72) Inventors: Qiang Wan, Hefei (CN); Jun Xia, Hefei (CN); Kangshu Zhan, Hefei (CN); Sen Li, Hefei (CN); Penghui Xu, Hefei (CN); Tao Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 399 days.

(21) Appl. No.: 17/604,057

(22) PCT Filed: Jul. 14, 2021

(86) PCT No.: PCT/CN2021/106144
§ 371 (c)(1),
(2) Date: Oct. 15, 2021

(87) PCT Pub. No.: WO2022/205673
PCT Pub. Date: Oct. 6, 2022

(65) Prior Publication Data
US 2023/0012863 A1 Jan. 19, 2023

(30) Foreign Application Priority Data
Mar. 30, 2021 (CN) .......................... 202110340669.5

(51) Int. Cl.
*H01L 21/027* (2006.01)
*H01L 21/033* (2006.01)
(Continued)

(52) U.S. Cl.
CPC .... *H01L 21/0337* (2013.01); *H01L 21/31144* (2013.01); *H10B 12/033* (2023.02); *H10B 12/09* (2023.02)

(58) Field of Classification Search
CPC .......... H01L 21/0337; H01L 21/31144; H01L 21/3086; H01L 21/76802; H01L 21/32139;
(Continued)

(56) References Cited

U.S. PATENT DOCUMENTS 9,059,254 B2 6/2015 Holmes et al.
9,224,744 B1 * 12/2015 Yokota ............. H01L 21/32139
(Continued)

FOREIGN PATENT DOCUMENTS

CN          1367531 A     9/2002
CN       102915960 A     2/2013
(Continued)

OTHER PUBLICATIONS

International Search Report cited in PCT/CN2021/106144, mailed Jan. 5, 2022, 9 pages.

*Primary Examiner* — Shouxiang Hu
(74) *Attorney, Agent, or Firm* — Kilpatrick Townsend & Stockton LLP

(57) ABSTRACT

The present application relates to a mask structure, a semiconductor structure and methods for manufacturing the same. The method for manufacturing a mask structure includes: dividing an overall structure into two regions, and developing the array region and the periphery region with a negative photoresist.

15 Claims, 6 Drawing Sheets

(51) Int. Cl.
*H01L 21/311* (2006.01)
*H10B 12/00* (2023.01)

(58) Field of Classification Search
CPC ............. H01L 21/0274; H01L 21/0332; H01L 21/0338; H01L 28/90; H10B 12/09; H10B 12/033; H10B 12/03; H10B 12/30
See application file for complete search history.

(56) References Cited

U.S. PATENT DOCUMENTS

| | | | |
|---|---|---|---|
| 9,929,013 B2* | 3/2018 | Kim | .................... H01L 21/0337 |
| 2015/0279738 A1 | 10/2015 | Wells et al. | |
| 2019/0181014 A1* | 6/2019 | Chang | ................. H01L 21/3086 |

FOREIGN PATENT DOCUMENTS

| CN | 106328498 A | 1/2017 |
|---|---|---|
| CN | 109065501 A | 12/2018 |
| CN | 112133625 A | 12/2020 |
| CN | 113097143 A | 7/2021 |

* cited by examiner

MASK STRUCTURE, SEMICONDUCTOR STRUCTURE AND METHODS FOR MANUFACTURING SAME

CROSS-REFERENCE TO RELATED APPLICATIONS

The present application is a national stage entry of International Application No. PCT/CN2021/106144, filed on Jul. 14, 2021, which claims the priority to Chinese Patent Application 202110340669.5, titled "MASK STRUCTURE, SEMICONDUCTOR STRUCTURE AND METHODS FOR MANUFACTURING SAME", filed on Mar. 30, 2021. The entire contents of International Application No. PCT/CN2021/106144 and Chinese Patent Application 202110340669.5 are incorporated herein by reference.

TECHNICAL FIELD

The present invention relates to the manufacturing field of integrated circuits and electronic components, and in particular to, a mask structure, a semiconductor structure and manufacturing methods.

BACKGROUND

With the rapid development of semiconductor storage technology, the market has put forward higher requirements for the storage capacity of semiconductor storage products. For Dynamic Random Access Memory (DRAM), the distribution density of memory capacitors and the storage power of a single capacitor restrict the storage capacity and stability of the capacitor memory.

However, the existing memory capacitors have two problems in the process of defining capacitor hole patterns by Self-Aligned Double Patterning (SADP): first, due to the load effect caused by the difference in material selection ratio, two sides of a mask pattern obtained have a depth difference; and second, during the process of making the mask pattern in the existing process, the Spin-On hardmask (SOH) will form depressions in the patterns of different densities, and the depressions easily damage the obtained mask pattern when the pattern is transferred. The above two aspects will cause the defect of non-uniform size of the semiconductor structure obtained by transferring the mask pattern, resulting in a decrease in the performance of the obtained semiconductor structure.

SUMMARY

According to some embodiments, a mask structure, a semiconductor structure and a method for manufacturing the same are provided.

A method for manufacturing a mask structure includes:
forming a laminated structure including a first dielectric layer, a first mask layer, a second dielectric layer and a second mask layer sequentially stacked from bottom to top, the laminated structure including an array region and a periphery region outside the array region;
patterning the second mask layer in the array region and the second dielectric layer in the array region, to form a pattern structure in the array region, the pattern structure exposing the first mask layer;
forming a first mask pattern on side walls of the pattern structure, and removing the pattern structure based on the first mask pattern;
forming a first patterned photoresist layer, the first patterned photoresist layer covering the array region and covering the first mask pattern; removing the second mask layer in the periphery region, to expose the second dielectric layer in the periphery region;
forming a third dielectric layer, the third dielectric layer covering the second dielectric layer in the periphery region and upper surface of the first patterned photoresist layer; and
flattening an obtained structure, so that upper surface of remaining part of the first patterned photoresist layer and upper surface of the remaining part of the second dielectric layer are flush with upper surface of the first mask pattern.

A mask structure is manufactured by the method described above.

A method for manufacturing a semiconductor structure includes:
providing a substrate;
forming a material layer to be etched on the substrate;
manufacturing a target mask pattern on upper surface of the material layer to be etched by using the above-mentioned method; and
etching the material layer to be etched based on the target mask pattern to obtain the semiconductor structure.

A semiconductor structure is proposed, the semiconductor structure is manufactured by the above-mentioned method.

The above description is only an overview of the technical solutions of the present invention. In order to understand the technical means of the present invention more clearly and implement the same in accordance with the content of the specification, the preferred embodiments of the present invention are described in detail below with reference to the accompanying drawings.

BRIEF DESCRIPTION OF THE DRAWINGS

In order to describe the technical solutions of the embodiments of the present application more clearly, the following briefly introduces the accompanying drawings required for describing the embodiments. Apparently, the accompanying drawings in the following description show only some embodiments of the present application, and those of ordinary skill in the art may still derive drawings of other embodiments from these accompanying drawings without any creative efforts.

DETAILED DESCRIPTION

Figure 1:
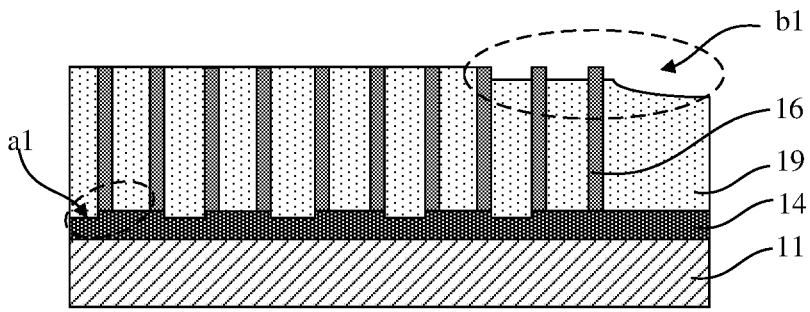
FIG. 1 is a partial cross-sectional structure diagram of a mask structure provided in an embodiment.

In order to facilitate the understanding of the present application, the present application will be described more comprehensively below with reference to the relevant accompanying drawings. Preferred embodiments of the present application are given in the drawings. However, the present application may be implemented in many different forms, and is not limited to the embodiments described herein. Rather, these embodiments are provided so that the disclosure of the present application is more thorough and comprehensive.

Unless otherwise defined, all technological and scientific terms used herein have the same meanings as commonly understood by those of ordinary skill in the technical field of the present application. The terms used in the description of the present application are only for the purpose of describing specific embodiments, but are not intended to limit the present application. The term "and/or" used herein comprises any and all combinations of one or more relevant listed items.

It should be understood that, when an element or layer is referred to as being "on", "adjacent to", "connected to", or "coupled to" other element or layer, the element or layer may be directly on, adjacent to, connected to, or coupled to the other element or layer, or there may be an intermediate element or layer therebetween. In contrast, when an element is referred to as being "directly on", "directly adjacent to", "directly connected to", or "directly coupled to" other element or layer, there is no intermediate element or layer therebetween. It should be understood that, although the terms first, second, third, etc. may be used to describe various elements, components, regions, layers and/or portions, these elements, components, regions, layers and/or portions should not be restricted by these terms. These terms are only used to distinguish one element, component, region, layer or portion from another element, component, region, layer or portion. Therefore, the first element, component, region, layer or portion discussed below may be represented as a second element, component, region, layer or portion, without departing from the teachings of the present application.

Spatial relationship terms such as "under", "below", "lower", "beneath", "above", "upper", etc. may be used here to conveniently describe the relationship between one element or feature shown in the figure and other element or feature. It should be understood that, in addition to the orientations shown in the figures, the spatial relationship terms also include different orientations of devices in use and operation. For example, if a device in the figure is turned over, an element or feature described as "below" or "under" or "beneath" other element will be oriented "on" the other element or feature. Therefore, the exemplary terms "below" and "under" may include both orientations of above and below. The device may be oriented otherwise (rotated 90 degrees or oriented in other ways), and the spatial terms used herein are interpreted accordingly.

The terms used here are only intended to describe specific embodiments and not to serve as limitations of the present application. When used here, the singular forms of "a", "an" and "said/the" also include plural forms, unless the context clearly indicates otherwise. It should also be understood that the terms "compose" and/or "include", when used in this specification, determine the existence of the described features, integers, steps, operations, elements and/or components, but do not exclude the existence or addition of one or more other features, integers, steps, operations, elements, components, and/or groups. As used herein, the term "and/or" includes any and all combinations of relevant listed items.

The embodiments of the application are described here with reference to cross-sectional views as schematic diagrams of ideal embodiments (and intermediate structures) of the present application. As such, changes in the shape shown due to, for example, manufacturing technology and/or tolerance can be expected. Therefore, the embodiments of the present application should not be limited to the specific shapes of the regions shown here, but include shape deviations due to, for example, manufacturing. The regions shown in the figures are schematic in nature, and their shapes are not intended to display the actual shapes of regions of a device and not intended to limit the scope of the present application.

Referring to FIG. 1, in a memory capacitor manufacturing technology, when the Self-Aligned Double Patterning (SADP) defines a mask pattern of a capacitor hole, the load effect caused by the difference in material selection ratio results in an etching depth difference (as shown by a1 in FIG. 1) between two sides of the etched mask pattern; and in different density patterns, after Spin-On hardmask (SOH) is covered, a depression (as shown by b1 in FIG. 1) easily appears in the upper surface of the mask pattern, resulting in uneven upper surface of the Spin-On mask layer, which easily causes damage to a mask during pattern transfer to obtain a defective semiconductor structure later. Therefore, a novel method for manufacturing a mask structure is required to improve the above defect, so as to accurately transfer the pattern features of the mask structure, improve the accuracy of the patterning process, and ensure the accuracy of the formed semiconductor structure.

Refer to FIGS. 2-16. It should be noted that the drawings provided in this embodiment merely illustrate the basic idea of the present application in a schematic manner, the drawings only show components related to the present application but are not drawn according to the number, shape and size of the components during actual implementation, the type, quantity and proportion of each component may be changed arbitrarily during actual implementation, and the component layout pattern may also be more complex.

Figure 2:
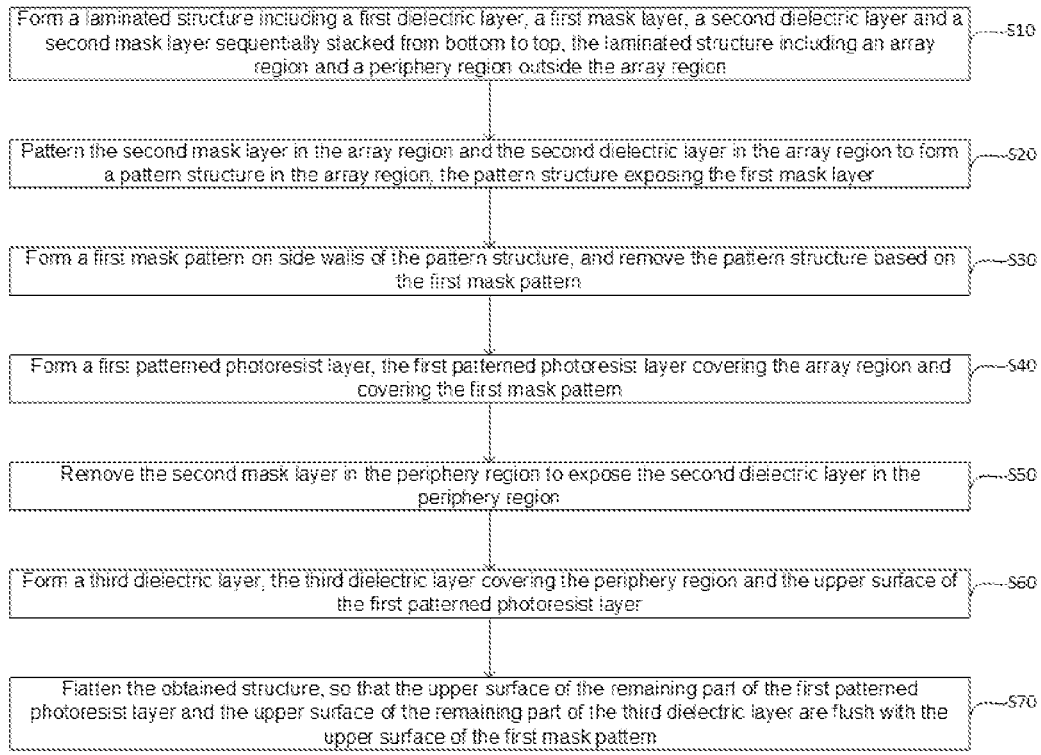
FIG. 2 is a schematic flowchart of a method for manufacturing a mask structure provided in an embodiment.

In an embodiment of the present application, as shown in FIG. 2, a method for manufacturing a mask structure is provided, including the following steps:

- Step S10: forming a laminated structure including a first dielectric layer, a first mask layer, a second dielectric layer and a second mask layer sequentially stacked from bottom to top, the laminated structure including an array region and a periphery region outside the array region;
- Step S20: patterning the second mask layer in the array region and the second dielectric layer in the array region to form a pattern structure in the array region, the pattern structure exposing the first mask layer;
- Step S30: forming a first mask pattern on side walls of the pattern structure, and removing the pattern structure based on the first mask pattern;
- Step S40: forming a first patterned photoresist layer, the first patterned photoresist layer covering the array region and covering the first mask pattern;
- Step S50: removing the second mask layer in the periphery region to expose the second dielectric layer in the periphery region;
- Step S60: forming a third dielectric layer, the third dielectric layer covering the second dielectric layer in the periphery region and the upper surface of the first patterned photoresist layer; and
- Step S70: flattening the obtained structure, so that the upper surface of the remaining part of the first patterned photoresist layer and the upper surface of the remaining part of the second dielectric layer are flush with the upper surface of the first mask pattern.

In the method for manufacturing a mask structure provided in the above embodiment, the second mask layer in the array region and the second dielectric layer in the array region are patterned to form a pattern structure in the array region; a first mask pattern is formed on side walls of the pattern structure, and the pattern structure is removed based on the first mask pattern; a first patterned photoresist layer is formed, the first patterned photoresist layer covering the array region and covering the first mask pattern; the second mask layer in the periphery region is removed to expose the second dielectric layer in the periphery region; a third dielectric layer is formed, the third dielectric layer covering the second dielectric layer in the periphery region and the upper surface of the first patterned photoresist layer; and the obtained structure is flattened, so that the upper surface of the remaining part of the first patterned photoresist layer and the upper surface of the remaining part of the second dielectric layer are flush with the upper surface of the first mask pattern; wherein the overall structure is divided into two regions, the array region and the periphery region are developed with a negative photoresist, which can avoid depressions caused by different density patterns and a load effect caused by the difference in material selection ratio, and optimize different pattern density regions; wherein by manufacturing the mask structure in which the upper surface of the remaining part of the first patterned photoresist layer and the upper surface of the remaining part of the second dielectric layer are flush with the upper surface of the first mask pattern, the pattern features of the mask structure are accurately transferred to improve the accuracy of the patterning process and ensure the accuracy of the formed semiconductor structure.

Figure 3:
FIG. 3 is a partial cross-sectional structure diagram of forming a laminated structure provided in an embodiment.
Figure 3:
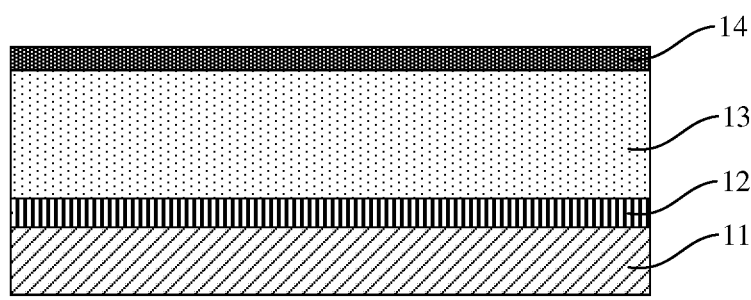
Figure 4:
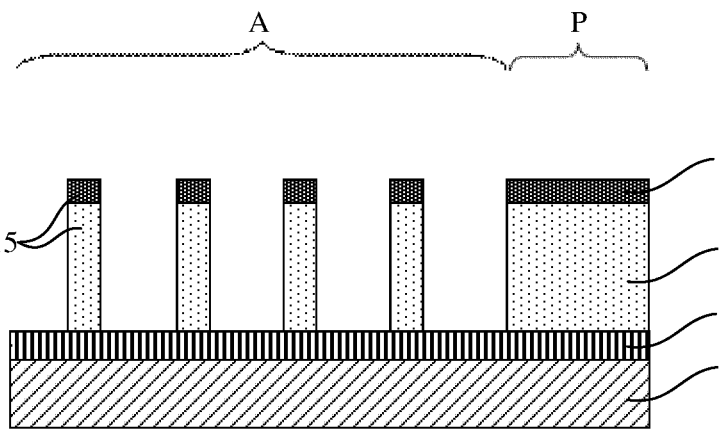
FIG. 4 is a partial cross-sectional structure diagram of forming a pattern structure provided in an embodiment.

As an example, FIG. 3 shows the laminated structure provided in step S10, wherein the first dielectric layer 11 includes but is not limited to an Amorphous Carbon Layer (ACL), the first mask layer 12 includes but is not limited to a polysilicon layer, the second dielectric layer 13 includes but is not limited to a Spin-On hardmask layer (SOH), and the second mask layer 14 includes but is not limited to a silicon oxynitride layer (SiON). The laminated structure is divided into an array region A (Array) and a periphery region P (Periphery) outside the array region, which facilitates subsequent deposition of photoresist layers twice to optimize different pattern density regions and obtain a flat upper surface of the mask pattern. The second mask layer 14 and the second dielectric layer 13 in the array region A are selectively patterned to form a pattern structure 15, and the second mask layer 14 and the second dielectric layer 13 in the periphery region P are retained, referring to FIG. 4.

Figure 5:
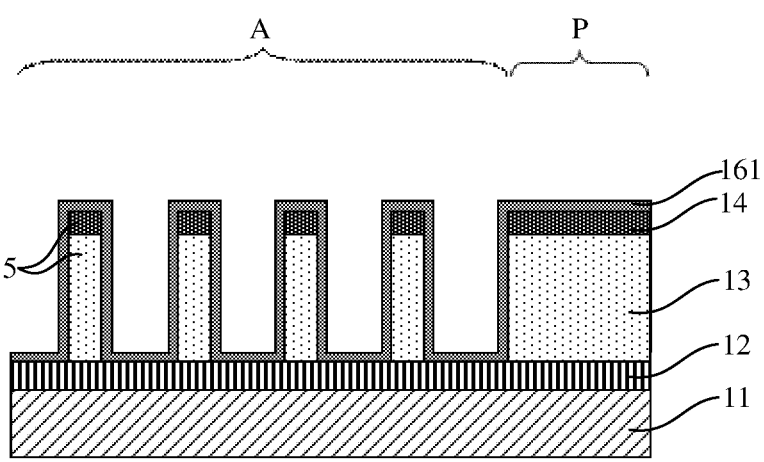
FIG. 5 is a partial cross-sectional structure diagram of forming a first mask material layer provided in an embodiment.

In an embodiment, step S30: forming a first mask pattern 16 on side walls of the pattern structure 15, and removing the pattern structure 15 based on the first mask pattern 16, includes the following steps:

- Step S31: forming a first mask material layer 161 on the side walls of the pattern structure 15, the upper surface of the pattern structure 15, the upper surface of the first mask layer 12 exposed in the array region A, and the upper surface of the second mask layer 14 in the periphery region P, as shown in FIG. 5;

As an example, the first mask material layer 161 is manufactured by Atomic Layer Deposition (ALD), and the first mask material layer 161 includes but is not limited to a silicon oxide layer.

- Step S32: removing the first mask material layer 161 on the upper surface of the pattern structure 15 and the upper surface of the first mask layer 12 exposed in the array region A to form the first mask pattern 16 on the side walls of the pattern structure 15; the first mask material layer 161 in the periphery region P being retained after the first mask pattern 16 is formed.

Figure 6:
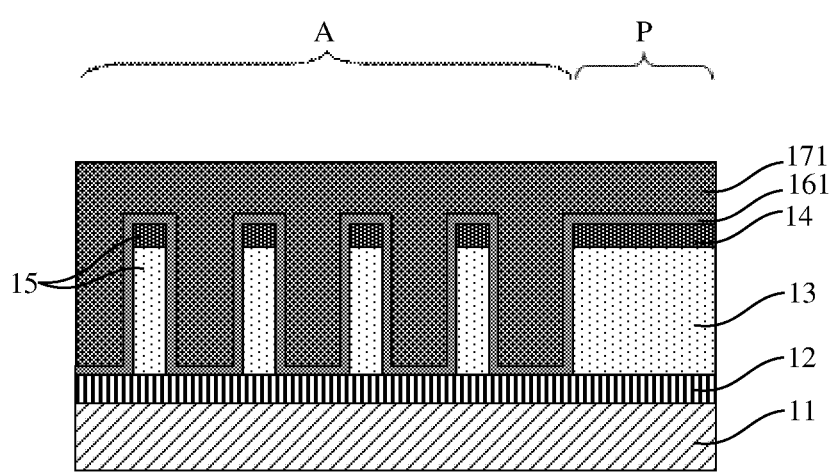
FIG. 6 is a partial cross-sectional structure diagram of forming a second photoresist layer provided in an embodiment.
Figure 7:
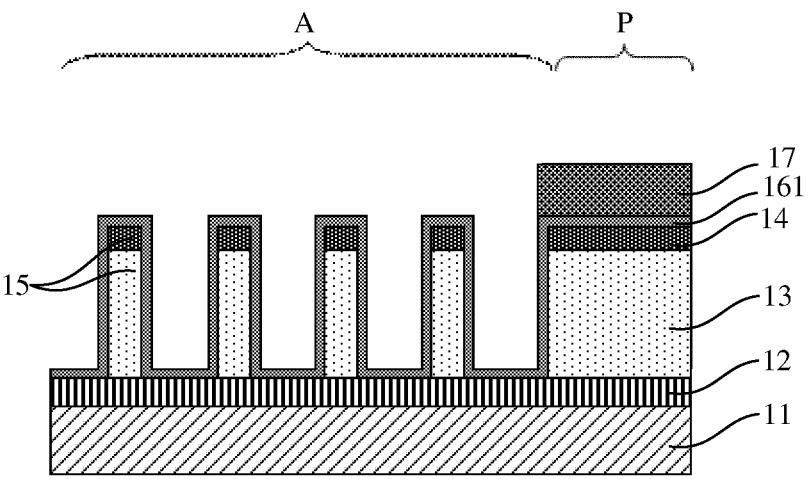
FIG. 7 is a partial cross-sectional schematic diagram of a structure obtained after patterning the second photoresist layer provided in an embodiment.
Figure 8:
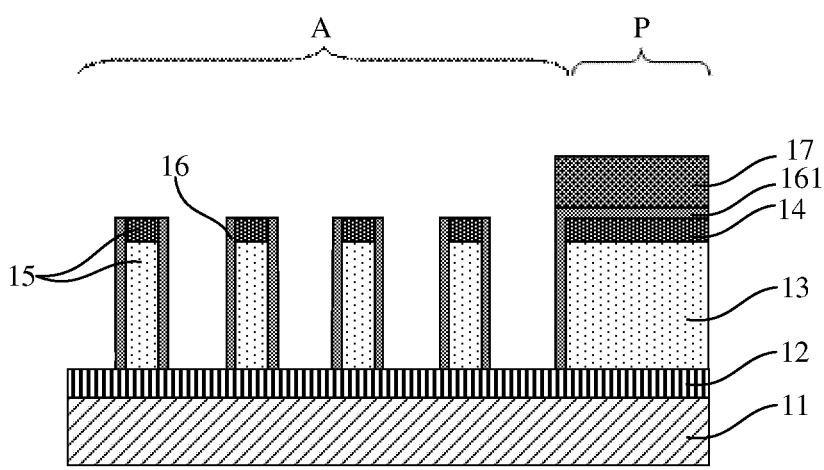
FIG. 8 is a partial cross-sectional schematic diagram of a structure obtained by removing part of the first mask material layer provided in an embodiment.

In an embodiment, step S32: removing the first mask material layer on the upper surface of the pattern structure and the upper surface of the first mask layer exposed in the array region A to form the first mask pattern on the side walls of the pattern structure, includes the following steps:

- Step S321: forming a second photoresist layer 171, the second photoresist layer 171 covering the upper surface of the first mask material layer 161, the upper surface of the second photoresist layer 171 being higher than that of the first mask material layer 161, as shown in FIG. 6;
- Step S322: patterning the second photoresist layer 171, and removing the second photoresist layer 171 in the array region A to obtain a second patterned photoresist layer 17, the second patterned photoresist layer 17 covering the upper surface of the first mask material layer 161 in the periphery region P, as shown in FIG. 7;
- Step S323: removing the first mask material layer 161 on the upper surface of the pattern structure 15 and the upper surface of the first mask layer 12 exposed in the array region A to form the first mask pattern 16 on the side walls of the pattern structure 15, as shown in FIG. 8.

As an example, the second photoresist layer is a negative photoresist layer.

Figure 9:
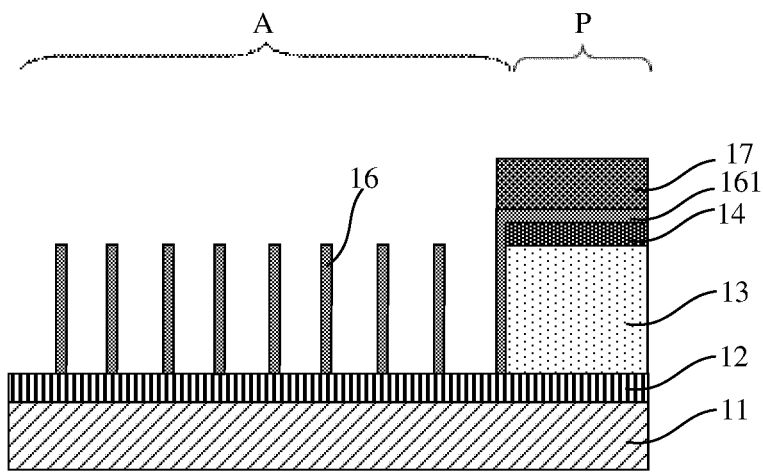
FIG. 9 is a partial cross-sectional schematic diagram of a structure obtained by removing the pattern structure provided in an embodiment.

In an embodiment, referring to FIG. 9, in step S30, the pattern structure 15 is removed based on the first mask pattern 16, the upper part of the pattern structure 15 is the patterned second mask layer 14, and the lower part of the pattern structure 15 is the patterned second dielectric layer 13. The etching selection ratio of the second mask layer 14 to the first mask layer 12 is set to be greater than 1, that is, the etching rate of the second mask layer 14 is much greater than that of the first mask layer 12, which ensures that the first mask layer 12 exposed in the array region A will not be damaged during dry etching with a high selection ratio while the second mask layer 14 in the array region A is etched, thereby avoiding the formation of a depth difference. The second patterned photoresist layer 17 in the periphery region P is retained.

As an example, continuing to refer to FIG. 9, the etching selection ratio of the first mask pattern 16 to the first mask layer 12 is greater than 1, that is, the etching rate of the first mask pattern 16 is much greater than that of the first mask layer 12, so that the upper surface of the remaining part of the first mask pattern is flush with the upper surface of the second dielectric layer in the periphery region P.

Figure 10:
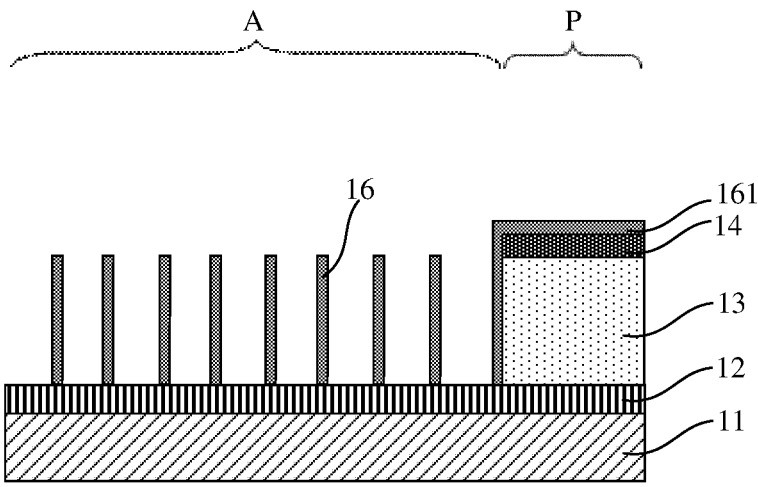
FIG. 10 is a partial cross-sectional schematic diagram of a structure obtained after removing the remaining second patterned photoresist layer provided in an embodiment.

In an embodiment, as shown in FIG. 10, before step S40: forming a first patterned photoresist layer 18, the method further includes a step of removing the second patterned photoresist layer 17.

Figure 11:
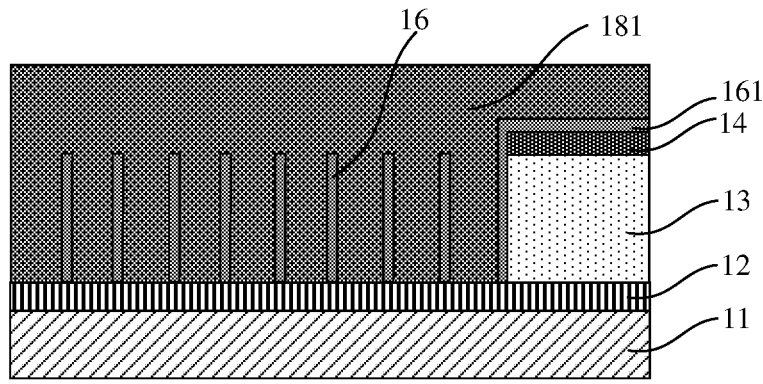
FIG. 11 is a partial cross-sectional structure diagram of forming a first photoresist layer provided in an embodiment.
Figure 12:
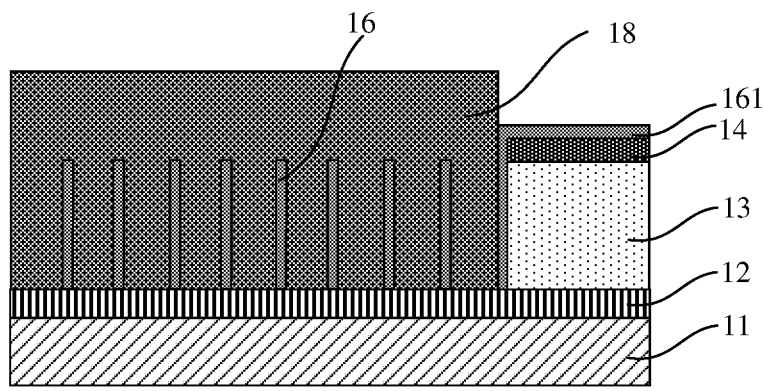
FIG. 12 is a partial cross-sectional schematic diagram of a structure obtained after patterning the first photoresist layer provided in an embodiment.

In an embodiment, step S40: forming a first patterned photoresist layer 18, the first patterned photoresist layer 18 covering the array region A and covering the first mask pattern 16, includes the following steps:
  Step S41: forming a first photoresist layer 181, the first photoresist layer 181 covering the array region A and the periphery region P, as shown in FIG. 11;
  Step S42: patterning the first photoresist layer 181, removing the first photoresist layer 181 in the periphery region P, to obtain the first patterned photoresist layer 18, the upper surface of the first patterned photoresist layer 18 being higher than the upper surface of the first mask pattern 16 and the upper surface of the second dielectric layer 13, as shown in FIG. 12.

As an example, the first photoresist layer 181 is a negative photoresist layer.

Figure 13:
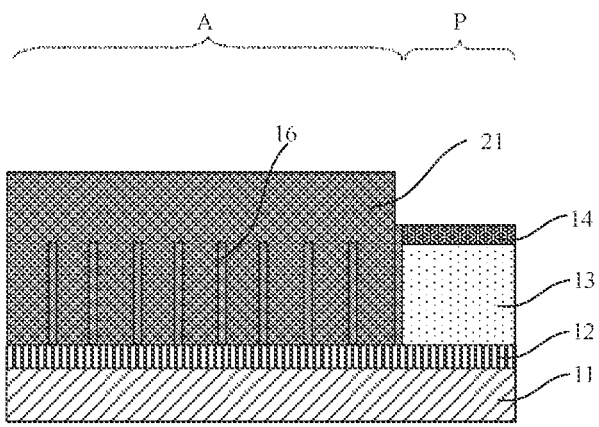
FIG. 13 is a partial cross-sectional schematic diagram of a structure obtained after removing the first mask material layer in the periphery region provided in an embodiment.

In an embodiment, as shown in FIG. 13, before removing the second mask layer 14 in the periphery region P, the method further includes: removing the first mask material layer 161 in the periphery region P.

As an example, the remaining part of the first mask material layer 161 on one side of the second mask layer 14 and the second dielectric layer 13 belongs to the array region A, as a part of the first mask pattern 16 in the array region A.

Figure 14:
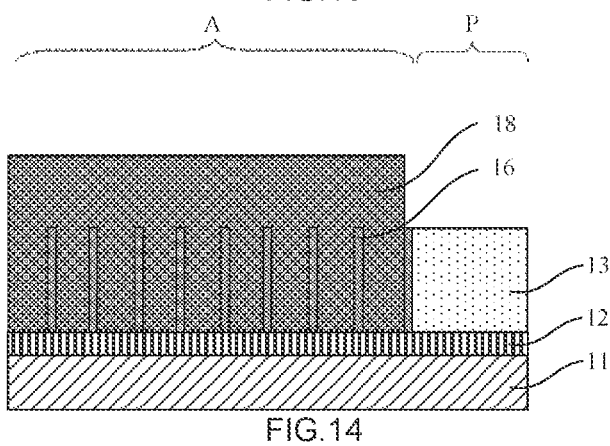
FIG. 14 is a partial cross-sectional schematic diagram of a structure obtained after removing the second mask layer in the periphery region provided in an embodiment.

In an embodiment, as shown in FIG. 14, the second mask layer 14 in the periphery region P is removed in step S50 to expose the second dielectric layer 13 in the periphery region P. The upper surface of the exposed second dielectric layer 13 is flush with the upper surface of the first mask pattern 16.

In an embodiment, after removing the second mask layer 14 in the periphery region P, the method further includes removing part of the first mask material layer 161 on one side of the second mask layer 14 and the second dielectric layer 13, so that the top of the remaining part of the first mask material layer 161 is flush with the upper surface of the first mask pattern 16.

Figure 15:
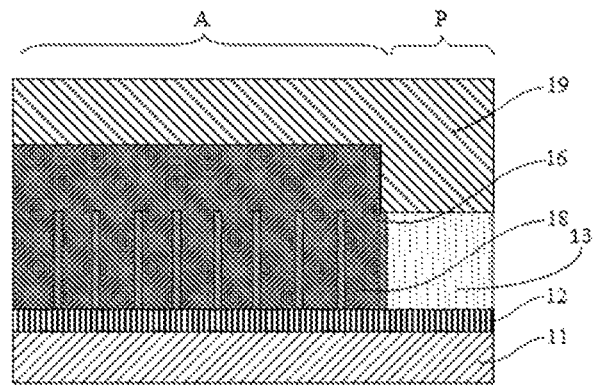
FIG. 15 is a partial cross-sectional structure diagram of forming a third dielectric layer provided in an embodiment.

In an embodiment, as shown in FIG. 15, the third dielectric layer 19 is formed in step S60, the third dielectric layer 19 covering the second dielectric layer 13 in the periphery region P and the upper surface of the first patterned photoresist layer 18. As an example, one or more of Chemical Vapor Deposition (CVD), Atomic Layer Deposition (ALD), High Density Plasma (HDP), and plasma enhanced deposition are used. In the present application, the third dielectric layer 19 is preferably formed by HDP. The third dielectric layer 19 may include, but is not limited to, a Spin-On hardmask (SOH) layer.

Figure 16:
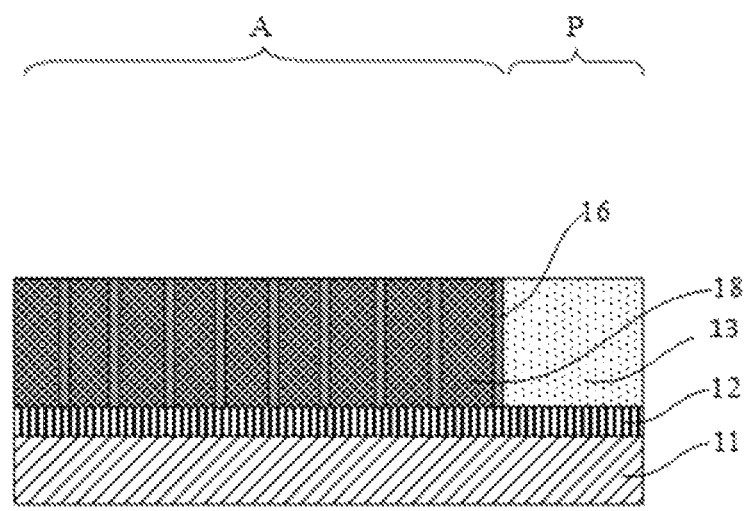
FIG. 16 is a partial cross-sectional schematic diagram of a structure obtained after flattening provided in an embodiment.

In an embodiment, as shown in FIG. 16, the structure obtained after forming the third dielectric layer 19 is flattened by using a flat push etching process, so that the upper surface of the remaining part of the first patterned photoresist layer 18 and the upper surface of the remaining part of the second dielectric layer 13 are flush with the upper surface of the first mask pattern 16, to eliminate depressions caused by different pattern density regions.

As an example, the first mask pattern 16 extends in a first direction; after flattening the obtained structure, the method further includes: forming a second mask pattern (not shown) on the first mask pattern 16, the second mask pattern extending in a second direction, and the second direction intersecting the first direction. The intersecting angle between the first direction and the second direction is greater than 0° and less than or equal to 90°; specifically, the intersecting angle between the first direction and the second direction is 10°, 20°, 30°, 40°, 50°, or 90°.

As an example, the method for manufacturing the second mask pattern is the same as the method for manufacturing the first mask pattern, details are not described again, and reference may be made to the manufacturing process of the first mask pattern.

In an embodiment, after forming a second mask pattern on the first mask pattern 16, the method further includes: patterning the first mask layer 12 and the first dielectric layer 11 based on the second mask pattern and the first mask pattern 16 to obtain a target mask pattern.

In an embodiment of the present application, a mask structure is further provided, which is manufactured by the above-mentioned method for manufacturing a mask structure.

In an embodiment of the present application, a method for manufacturing a semiconductor structure is further provided, including the following steps:
  S1: providing a substrate;
  S2: forming a material layer to be etched on the substrate;
  S3: manufacturing the target mask pattern on the upper surface of the material layer to be etched by using the above-mentioned method for manufacturing a mask structure; and
  S4: etching the material layer to be etched based on the target mask pattern to obtain the semiconductor structure.

In the method for manufacturing a semiconductor structure provided in the above embodiment, a substrate is provided; a material layer to be etched is formed on the substrate; and the target mask pattern is manufactured on the upper surface of the material layer to be etched by using the above-mentioned method for manufacturing a mask structure, so that structural features can be accurately transferred. The material layer to be etched is etched based on the target mask pattern with accurate pattern features, to ensure that the formed semiconductor structure also has the target mask pattern with an accurate pattern structure, which is beneficial to manufacturing a semiconductor structure with a uniform size.

In an embodiment of the present application, a semiconductor structure is further proposed, the semiconductor structure being manufactured by the above-mentioned method for manufacturing a semiconductor structure.

It should be noted that the above-mentioned embodiments are only for illustrative purposes and do not mean to limit the present application.

It should be understood that, unless explicitly described herein, the execution of the steps is not limited to a strict order, instead, the steps may be executed in other order. In addition, at least some of the steps may include a plurality of sub-steps or a plurality of stages. These sub-steps or stages are not necessarily executed at the same time, but can be executed at different time. These sub-steps or stages are also not necessarily executed in succession, but can be executed in turn or alternately with at least some other steps or sub-steps or stages of other steps.

The embodiments in this specification are all described in a progressive manner. Each embodiment focuses on the differences from other embodiments, and the same or similar parts between the embodiments may be referred to each other.

The technical features of the above-mentioned embodiments may be combined arbitrarily. For the purpose of simplicity in description, all the possible combinations of the technical features in the above embodiments are not described. However, as long as the combinations of these technical features do not have contradictions, they shall fall within the scope of this specification.

The invention claimed is:

1. A method for manufacturing a mask structure, comprising:
    forming a laminated structure comprising a first dielectric layer, a first mask layer, a second dielectric layer and a second mask layer sequentially stacked from bottom to top, the laminated structure comprising an array region and a periphery region outside the array region;
    patterning the second mask layer in the array region and the second dielectric layer in the array region, to form a pattern structure in the array region, the pattern structure exposing the first mask layer;
    forming a first mask pattern on side walls of the pattern structure, and removing the pattern structure based on the first mask pattern;
    forming a first patterned photoresist layer, the first patterned photoresist layer covering the array region and covering the first mask pattern;
    removing the second mask layer in the periphery region, to expose the second dielectric layer in the periphery region;
    forming a third dielectric layer, the third dielectric layer covering the second dielectric layer in the periphery region and an upper surface of the first patterned photoresist layer; and
    flattening an obtained structure, so that an upper surface of a remaining part of the first patterned photoresist layer and an upper surface of a remaining part of the second dielectric layer are flush with an upper surface of the first mask pattern.

2. The method according to claim 1, wherein the forming a first mask pattern on side walls of the pattern structure comprises:
    forming a first mask material layer on the side walls of the pattern structure, an upper surface of the pattern structure, an upper surface of the first mask layer exposed in the array region, and an upper surface of the second mask layer in the periphery region; and
    removing the first mask material layer on the upper surface of the pattern structure and the upper surface of the first mask layer exposed in the array region, to form the first mask pattern on the side walls of the pattern structure; the first mask material layer in the periphery region being retained after the first mask pattern is formed.

3. The method according to claim 2, wherein the removing the first mask material layer on the upper surface of the pattern structure and the upper surface of the first mask layer exposed in the array region, to form the first mask pattern on the side walls of the pattern structure comprises:
    forming a second photoresist layer, the second photoresist layer covering an upper surface of the first mask material layer, and an upper surface of the second photoresist layer being higher than the upper surface of the first mask material layer;
    patterning the second photoresist layer, and removing the second photoresist layer in the array region, to obtain a second patterned photoresist layer, the second patterned photoresist layer covering an upper surface of the first mask material layer in the periphery region; and
    removing the first mask material layer on the upper surface of the pattern structure and the upper surface of the first mask layer exposed in the array region, to form the first mask pattern on the side walls of the pattern structure.

4. The method according to claim 3, wherein before the forming a first patterned photoresist layer, the method further comprises: removing the second patterned photoresist layer.

5. The method according to claim 3, wherein the forming a first patterned photoresist layer comprises:
    forming a first photoresist layer, the first photoresist layer covering the array region and the periphery region; and
    patterning the first photoresist layer and removing the first photoresist layer in the periphery region, to obtain the first patterned photoresist layer, the upper surface of the first patterned photoresist layer being higher than the upper surface of the first mask pattern and an upper surface of the second dielectric layer.

6. The method according to claim 5, wherein the first photoresist layer and the second photoresist layer are both negative photoresist layers.

7. The method according to claim 2, wherein before the removing the second mask layer in the periphery region, the method further comprises: removing the first mask material layer in the periphery region.

8. The method according to claim 1, wherein an etching selection ratio of the second mask layer to the first mask layer is greater than 1.

9. The method according to claim 1, wherein an etching selection ratio of the first mask pattern to the first mask layer is greater than 1.

10. The method according to claim 1, wherein the obtained structure is flattened by using a flat push etching process, so that the upper surface of the remaining part of the first patterned photoresist layer and the upper surface of the remaining part of the second dielectric layer are flush with the upper surface of the first mask pattern.

11. The method according to claim 1, wherein the first mask pattern extends in a first direction; after the flattening an obtained structure, the method further comprises: forming a second mask pattern on the first mask pattern, the second mask pattern extending in a second direction, and the second direction intersecting the first direction.

12. The method according to claim 11, wherein after the forming a second mask pattern on the first mask pattern, the method further comprises: patterning the first mask layer and the first dielectric layer based on the second mask pattern and the first mask pattern, to obtain a target mask pattern.

13. A method for manufacturing a semiconductor structure, comprising:
   providing a substrate;
   forming a material layer to be etched on the substrate;
   manufacturing the target mask pattern on an upper surface of the material layer to be etched by using the method according to claim 12; and
   etching the material layer to be etched based on the target mask pattern, to obtain the semiconductor structure.

14. A semiconductor structure, manufactured by the method according to claim 13.

15. A mask structure, manufactured by the method according to claim 1.

* * * * *